(12) United States Patent
Schöner et al.

(10) Patent No.: US 6,703,294 B1
(45) Date of Patent: *Mar. 9, 2004

(54) METHOD FOR PRODUCING A REGION DOPED WITH BORON IN A SIC-LAYER

(75) Inventors: Adolf Schöner, Kista (SE); Kurt Rottner, Kista (SE)

(73) Assignee: Cree, Inc., Durham, NC (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1297 days.

(21) Appl. No.: 08/735,389

(22) Filed: Oct. 21, 1996

(51) Int. Cl.[7] .............................................. H01L 21/265
(52) U.S. Cl. ....................................... 438/519; 438/520
(58) Field of Search ........................... 437/22, 20, 100, 437/24; 257/77; 148/DIG. 148

(56) References Cited

U.S. PATENT DOCUMENTS

| | | | |
|---|---|---|---|
| 4,209,474 A | 6/1980 | Prochazka | 264/29.5 |
| 5,318,915 A | * 6/1994 | Baliga et al. | 437/24 |
| 5,385,762 A | * 1/1995 | Prins | 427/526 |
| 5,543,637 A | * 8/1996 | Baliga | 257/77 |

FOREIGN PATENT DOCUMENTS

WO     WO 96/20298     7/1996

OTHER PUBLICATIONS

Rao et al., A1, AL/C and A1/Si Implantations in 6H–SiC, Journal of Electronic Materials, vol. 25, No. 1, 1996.

Fukumoto, First–Principles Calculations of P–Type Impurities in Cubic SiC, Physical Review B, vol. 53, No. 8, Feb. 15, 1996.

Larkin et al., Site–Competition Epitaxy For Superior Silicon Carbide Electronics Appl. Phys. Lett. 65(13), Sep. 26, 1994.

Capacitance Spectroscopy of Boron–Doped Silicon Carbide, Journal: Fizika i Tekhnika Poluporvodnikov, vol. 29, No. 2, pp 370–377, Feb. 1995, Russia.

Incorporation Mechanism of N, A, and B Impurities In Chemical Vapor Deposition of SiC, Journal: Applied Physics Letters, vol. 67, No. 16, p. 2385–87, Oct. 16, 1995, U.S.A.

* cited by examiner

Primary Examiner—Savitri Mulpuri
(74) Attorney, Agent, or Firm—Connolly Bove Lodge & Hutz LLP

(57) ABSTRACT

A method for producing a crystalline layer of SiC having at least a region thereof doped with boron atoms comprises a step a) of ion implantation of boron into a layer (1) of crystalline SiC and a step b) of heating the SiC-layer for annealing it for making the boron implanted therein electrically active. The method further comprises a step c) of implanting carbon atoms in said layer (1) for forming carbon interstitials in excess with respect to carbon vacancies present in the SiC-layer before carrying out step b).

5 Claims, 1 Drawing Sheet

METHOD FOR PRODUCING A REGION DOPED WITH BORON IN A SIC-LAYER

TECHNICAL FIELD

The present invention relates to a method for producing a crystalline layer of SiC having at least a region thereof doped with boron atoms, comprising a step a) of ion implantation of boron into a layer of crystalline SiC, and a step b) of heating the SiC-layer for annealing it to make the boron implanted therein electrically active. This invention also relates to a semiconductor device produced by carrying out such a method.

BACKGROUND OF THE INVENTION

SiC has, in addition to the properties of a high breakdown voltage, a high thermal conductivity and a high thermal stability, i.e., the ability to operate at high temperatures, namely up to 1000° K, the character of only allowing extremely slow diffusion of dopants therein at convenient processing temperatures, so that the possibility to use the diffusion technique, and the advantages of that technique, is strongly reduced, as compared to Si, for obtaining doped regions in SiC.

As a consequence, ion implantation of dopants is an attractive alternative for obtaining doped regions in SiC-layers. Furthermore, boron has been shown to be an element well suited as a dopant for p-type layers or regions of SiC.

A method according to the introduction has therefore already been proposed, but that method has some drawbacks which derive from the fact that SiC is a compound material, meaning that doping atoms can potentially be incorporated on Si as well as on C lattice sites, and the inherent property of boron to behave differently on Si and on C site in the SiC crystal. Boron forms on the Si site an acceptor with an ionization energy of around 320 meV, whereas on the C site it forms a so-called D-center, a deep center with an ionization energy of about 650 meV. The character of the D-center has not been clarified yet, so that it is not certain that it will act as an acceptor or a donor there. In any way, the active doping concentration, given by the doping atoms forming shallow levels (ionization energy of about 320 meV) is therefore reduced by the atoms forming the D-centers. This effect would be even enhanced, when the two levels would be of different character, i.e. acceptor and donor, through which a compensation phenomena would occur.

Accordingly, it is not possible to obtain a region having, at a given temperature, a well-defined concentration of charge carriers in the form of holes deriving from dopants in the form of boron atoms, nor is it possible to obtain such a high concentration of such charge carriers that would be desired for obtaining a low resistance of the region, making it as suited as possible as a contact layer, by carrying out already known methods of the type defined in the introduction. By way of example, it may be mentioned that very precise control of the doping concentration is required for JTE.

SUMMARY OF THE INVENTION

The object of the present invention is to provide a method of the type defined in the introduction, enabling very precise control of the doping concentration obtained in the region of the SiC-layer.

This object is, according to the invention, obtained by providing such a method with the additional step c) of implanting carbon atoms in the layer for forming carbon interstitials in excess with respect to carbon vacancies present in the SiC-layer before carrying out step b), the step c) being carried out either a) before, b) after or c) at the same time as step a).

This technique may be called co-implantation and it results in additional carbon interstitials besides those already created by the bombardment of the SiC-layer during the ion implantation of boron in step a). When the SiC-layer after that is annealed, there will be a site competition, and as a consequence of the excess of C in the SiC-layer, the incorporation of the implanted boron atoms will be influenced in the direction of more such dopants on Si sites than on the C sites where they would form a D-center. In this way the incorporation of the implanted boron atoms can be influenced in a controlled way by adjusting the dose of carbon atoms implanted in the SiC-layer in step c). It will in this way be possible to influence the boron atoms to sit exactly where they have to sit in the SiC-layer, so that the behavior of this layer will be very well defined. This is also very important when a low doping concentration of this layer is desired. Thus, the invention constitutes a further step towards precise control over doping concentrations in SiC necessary for producing tailor-made doping profiles.

The existence of a different behavior of boron on Si and on C site in an SiC crystal has been studied and then disclosed by Ballandovich a.o. in Fizika i Tekhnika Poluprovodnikov, 1995, volume 29, No. 2, page 370–377. It described that two different centers are formed by boron incorporated in an epitaxial film of SiC by diffusion. Furthermore, it says that annealing at a temperature above 2300° C. reduces the concentration of D-centers. However, annealing at such high temperatures will set very high requirements on the quality of the equipment used, making it extremely expensive.

Kimoto et. al describes in the journal Applied Physics Letters, 1995, volume 67, No. 16, pages 2385–2387, how the doping efficiency of aluminium and boron are increased under C-rich conditions during the epitaxy of SiC. However, the dopants are here incorporated during epitaxy under control of the C/Si ratio. That this should work has also been suggested by Fukumoto in Physical Review B, volume 53, No. 8, 1996, in which simulations made concerning epitaxy of SiC under C-rich condition are presented.

Furthermore, Mulpuri et.al. discloses in Journal of Electronic Materials, volume 25, No. 1, 1996 on pages 75–80 an attempt to use the site competition concept in the case of implanting aluminium into an SiC-layer for doping said layer. However, it has turned out that the site-competition did not function at all, and the conclusion was that C or Si co-implantations do not improve the acceptor activation problem in SiC, although Kimoto et.al. have assumed that this was possible to obtain for Al by incorporation thereof during epitaxy of SiC under C-rich condition.

According to another preferred embodiment of the invention, the dose of carbon implanted in step c) is selected to direct the majority of the boron implanted in step a) to sites intended for silicon atoms in the region of the SiC-layer during the annealing of step b). By selecting the dosage in that way, the fact that boron may form D-centers in SiC may only have a negligible influence on the behavior of the dopants of the region in the SiC-layer so produced. Thus, it may with a high accuracy be said that the concentration of charge carriers deriving from the boron atoms in the region of the SiC-layer is only dependent on the doping concentration of the boron atoms incorporated in the SiC and the ionization energy of the shallow energy level on the Si sites as a function of other parameters, such as temperature, voltage etc. This means that the concentration of such charge carriers under a certain condition may be precisely controlled by selecting an appropriate dose of boron implanted into the SiC-layer during the ion implantation step a).

According to another preferred embodiment of the invention the dose of boron implanted is controlled during step a) for obtaining a determined concentration of boron sitting at the silicon sites in the region of the SiC-layer. The advantages of such control of the dose of boron appear from the previous paragraph of this disclosure.

According to another preferred embodiment of the invention, being a further development of the preferred embodiment of the invention mentioned firstly, boron is implanted in step a) at a dose lying close to the solubility limit of boron in SiC to obtain a low resistance of that region. It will, in this way, be possible to obtain the highest possible concentration of boron atoms at Si sites and thereby a very low resistance of that region at a given temperature, making this region or SiC-layer suited as a contact layer.

The present invention also comprises a semiconductor device according to the independent device claim, and the advantages of such a device clearly appear from the discussion above of the different embodiments of the method according to the invention.

Further advantages and preferred features of the invention will appear from the following description.

BRIEF DESCRIPTION OF THE DRAWING

With reference to the appended drawing, a specific description of a preferred embodiment of the invention is cited as an example.

In the drawing.

DETAILED DESCRIPTION OF A PREFERRED EMBODIMENT

Figure 1:
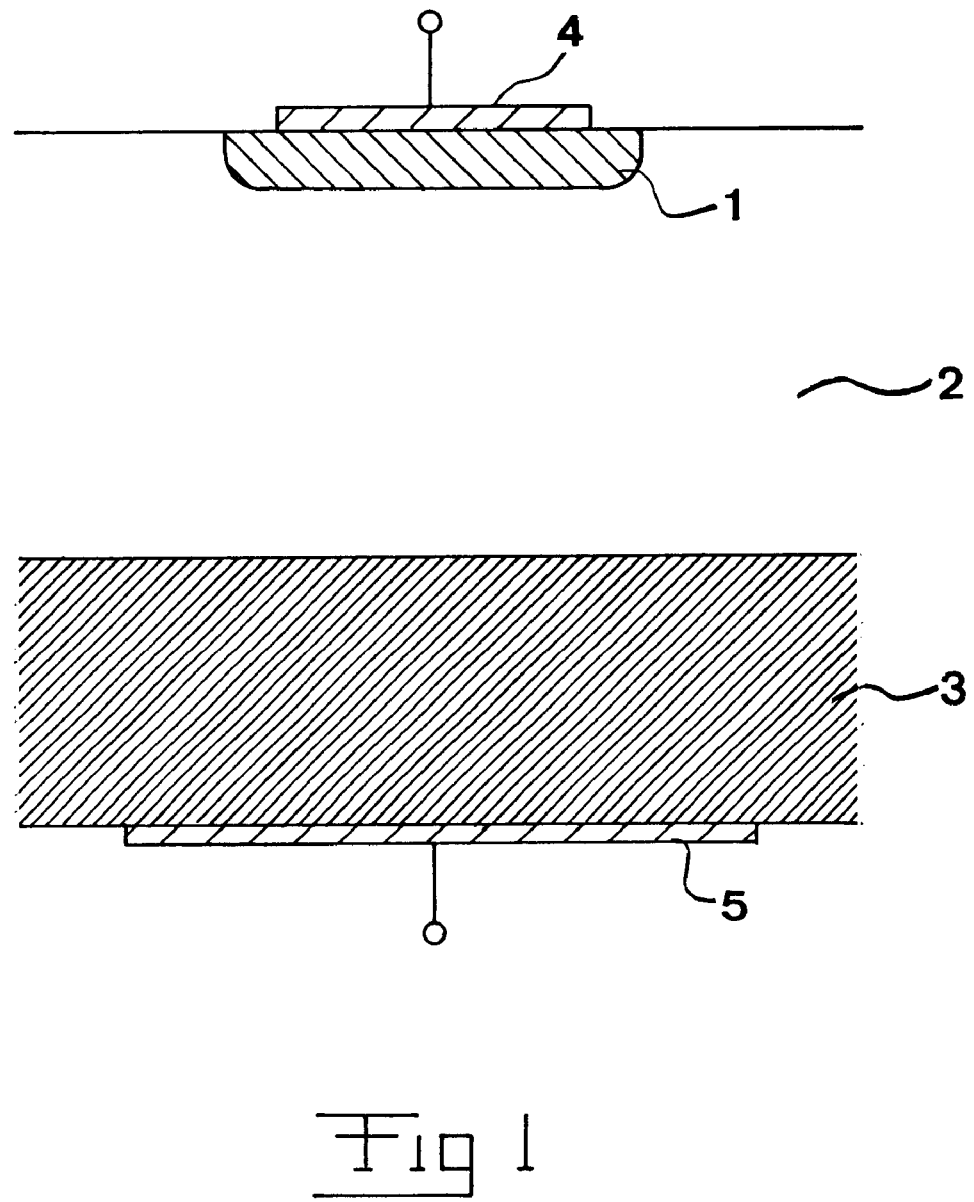
FIG. 1 illustrates schematically a semiconductor power device in the form of a rectifier diode of SiC, which has been produced while utilizing a method according to a preferred embodiment of the invention.

FIG. 1 illustrates by a way a non-limitative example of a device to which the invention may be applied; a semiconductor diode with three semiconductor layers of SiC, namely a first highly doped layer 1 of p-type, a second lightly doped layer 2 of n-type, and a third highly-doped layer 3 of n-type. The three layers are superimposed in the order mentioned. The device also has an ohmic metal contact 4 arranged on top of the first layer which forms the anode of the diode, and a second ohmic metal contact 5 arranged in contact with the third semiconductor layer and forming the cathode of the diode. Passivation layers have been left out, since they do not have anything to do with the invention. A device of this type may be produced by known growth and etching techniques.

However, in this case, the first layer of p-type has been produced by carrying out a method according to a preferred embodiment of the invention. First, the different layers have been epitaxially grown in a known way, preferably by Chemical Vapor Deposition (CVD). After that, boron atoms have been ionized and accelerated towards a surface of the SiC crystal created by correspondingly patterning a mask covering the top surface thereof while using acceleration energies exceeding 30 keV. Boron atoms are, in this way, implanted into the n-type layer 2 while forming the p-type layer 1 illustrated in the figure. The dose of the boron implanted is in the region of $1 \cdot 10^{14}$ cm$^{-2}$.

Carbon atoms are then also implanted into the layer 1, so that carbon interstitials are formed in excess with respect to carbon vacancies present in layer 1. After that, the SiC crystal is heated for annealing the layer 1 to make the boron implanted therein electrically active. The boron atoms will then compete with Si and C interstitials about the different Si and C vacancies. Because of the excess of carbon, a majority of the boron atoms activated will, after the annealing step, be found on Si sites, i.e. they have formed the shallow energy level, so that the doping concentration so obtained in layer 1 will predominantly be active above a certain temperature. In this way, a very well defined active dopant concentration is formed in the first layer 1, and this doping concentration will be high, lying close to the solubility limit of boron in SiC, resulting in low resistance of the layer 1, making it well suited as contact layer.

The invention is of course not in any way restricted to the preferred embodiment described above, but many possible modifications thereof will be apparent to one of ordinary skill in the art.

Although it has been shown how the method according to the invention is used as a part of the process for producing a diode, the method according to the invention may be used in production of all types of semiconductor devices, such as IGBT's, MOSFETs, thyristors, and so on.

The method according to the invention is only directed to producing a crystalline layer of SiC having at least a region thereof doped with boron atoms starting from a layer of crystalline SiC already produced. This layer of crystalline SiC will, of course, have some inevitable dopants and impurities although this is not recited in the claims.

It is possible to dope the entire SiC-layer with boron atoms or only a region thereof.

It is not necessary that all the semiconductor layers of the device used for the production of the disclosed method according to the invention be utilized, or that they are made of SiC, but the device may, for example, be a device having a so called heterojunction.

The definition of "layer" as used herein is to be interpreted broadly and comprises all types of volume extensions and shapes.

The word "crystalline" means a good periodicity of the lattice in the three dimensions over greater regions, i.e. typically polycrystalline structures are excluded.

The steps of implantation of the boron atoms and the carbon atoms may be carried out in an arbitrary order concurrently should suitable equipment be available.

What is claimed is:

1. A method for producing a crystalline layer of SiC having at least a region thereof doped with boron atoms, said method comprising the steps of:
   (a) implanting boron atoms into a layer of crystalline SiC;
   (b) implanting carbon atoms into said layer in order to form more carbon interstitials than the amount of carbon vacancies present in SiC and in a manner such that said layer remains crystalline; and
   (c) heating said layer to anneal it in order to make said boron atoms electrically active; and
   wherein step (b) is performed at either one of the following 1) before, 2) after or 3) at the same time as step (a).

2. A method according to claim 1, wherein step (b) further comprises selecting the dose of carbon implanted to direct the majority of the boron implanted in step a) to silicon lattice sites in said region of the SiC-layer during the annealing of step (c).

3. A method according to claim 2, wherein step (a) further comprises controlling the dose of boron implanted for obtaining a determined concentration of boron sitting at said silicon lattice sites in said region of the SiC-layer.

4. A method according to claim 2, wherein step (a) further comprises implanting boron atoms at a dose lying close to the solubility limit of boron in SiC for obtaining a low resistance of said region.

5. A method for producing a crystalline layer of SiC having at least a region thereof doped with boron atoms, said method comprising the steps of:

(a) implanting boron atoms into a layer of crystalline SiC;

(b) implanting carbon atoms into said layer in order to form more carbon interstitials than the amount of carbon vacancies present in SiC and in a manner such that said layer remains crystalline; and (c) heating said layer to anneal it in order to make said boron atoms electrically active;

wherein step (b) is performed at either one of the following 1) before, 2) after or 3) at the same time as step (a); and the dose of carbon directs the majority of the boron implanted in step a) to silicon lattice sites in said layer of SiC during step c).

* * * * *